United States Patent
Uetake

(10) Patent No.: US 9,087,797 B2
(45) Date of Patent: Jul. 21, 2015

(54) LIGHT-EMITTING ELEMENT DISPLAY DEVICE

(71) Applicant: Japan Display Inc., Tokyo (JP)

(72) Inventor: Naoki Uetake, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/174,865

(22) Filed: Feb. 7, 2014

(65) Prior Publication Data

US 2014/0225118 A1    Aug. 14, 2014

(30) Foreign Application Priority Data

Feb. 8, 2013   (JP) .................................. 2013-023115

(51) Int. Cl.
*H01L 33/00* (2010.01)
*H01L 27/32* (2006.01)

(52) U.S. Cl.
CPC .......... *H01L 27/3213* (2013.01); *H01L 27/322* (2013.01); *H01L 27/3216* (2013.01)

(58) Field of Classification Search
USPC .......... 257/59, 72, 88, 89, E33.055, E33.067, 257/E33.068
See application file for complete search history.

(56) References Cited

U.S. PATENT DOCUMENTS

| 2004/0012330 | A1 |   | 1/2004 | Ohshita et al. |
|---|---|---|---|---|
| 2012/0097933 | A1 | * | 4/2012 | Ando .............................. 257/40 |
| 2012/0206675 | A1 | * | 8/2012 | Seo et al. ........................ 349/96 |
| 2012/0235178 | A1 | * | 9/2012 | Mori .............................. 257/88 |
| 2012/0242218 | A1 | * | 9/2012 | Yoshinaga et al. ............. 313/504 |
| 2013/0153873 | A1 | * | 6/2013 | Watanabe et al. ............... 257/40 |

FOREIGN PATENT DOCUMENTS

JP    2004-103532    4/2004

* cited by examiner

*Primary Examiner* — Matthew E Warren
(74) *Attorney, Agent, or Firm* — Lowe Hauptman & Ham, LLP

(57) ABSTRACT

A light-emitting element display device including: a thin film transistor substrate that includes a transistor which controls an amount of light emission from each sub-pixel arranged on an entire display region; and a color filter substrate that is arranged to overlap with the thin film transistor substrate, and includes a color filter which causes a light having a predetermined wavelength region in each sub-pixel to pass. The thin film transistor substrate includes a first light-emitting layer that covers the entire display region and emits a light having one wavelength region, and a second light-emitting layer that emits a light having a wavelength region different from that of the first light-emitting layer, and covers a plurality of independent regions in the display region.

7 Claims, 10 Drawing Sheets

LIGHT-EMITTING ELEMENT DISPLAY DEVICE

CROSS-REFERENCE TO RELATED APPLICATION

The present application claims priority from Japanese application JP2013-023115 filed on Feb. 8, 2013, the content of which is hereby incorporated by reference into this application.

BACKGROUND OF THE INVENTION

1. Field of the Invention

The present invention relates to a light-emitting element display device which causes a light emitting element which is a self-luminous body arrayed in each pixel to emit a light and performs displaying.

2. Description of the Related Art

In recent years, an image display device (hereinafter, refer to as organic EL (electro-luminescent) display device) using a self-luminous body called an organic light emitting diode (OLED) has been in practical use. The organic EL display device is excellent in visibility and response speed compared to a liquid crystal display device in the related art because it uses the self-luminous body, and additionally, its thickness can be made thin because an auxiliary lighting device such as a back-light is not needed.

A color display in the aforementioned organic EL display device has two types as a main stream: one is a case where each pixel includes light emitting elements that emit lights in three colors of red (R), green (G), and blue (B) respectively, and the other is a case where a light of white color is emitted from a light emitting element and wavelength ranges of each of the three colors R, G, and B are transmitted through color filters of each pixel respectively. In the case where the white light is emitted, a method called tandem, in which two light emitting elements that emit two colors of light (for example, yellow and blue) are superimposed on separate layers to emit both lights, and then the white light is emitted, is known. In JP2004-103532A, a light emitting display device that performs a color display using light emitting elements of two colors is disclosed, not the tandem.

SUMMARY OF THE INVENTION

The process of manufacturing an OLED display device that respectively emits single colors of RGB requires a vapor deposit mask and a vapor deposit process dedicated to each of the three colors of RGB. However, since the accuracy of the vapor deposit process is lower than that in a photolithography process, the space between the pixels (more precisely, the space between the sub-pixels) is required to be larger, and thus, it is difficult to achieve high definition. On the other hand, when the definition increases, the opening ratio decreases. In order to obtain certain degree of brightness when the opening ratio is decreased, the current density per unit area has to be increased. As a result, a lifetime of element decreases and it is necessary to apply high voltage. In a case of extracting white color using the light emitting element of the tandem, light output rate to the outside from the display device with respect to light emission when displaying an image (hereinafter, refer to as light extraction efficiency) is decreased due to the fact that the necessary voltage is increased owing to lamination or due to the fact that a single color from white color is extracted using color filter, and thus, it ends up disturbing the low power consumption.

The present invention is to provide a light-emitting element display device which can display in the low power consumption state by increasing the light-extraction efficiency.

According to an aspect of the present invention, there is provided a light-emitting element display device including: a thin film transistor substrate that includes a transistor which controls an amount of light emission from each sub-pixel arranged on an entire display region; and a color filter substrate that is arranged to overlap with the thin film transistor substrate, and includes a color filter which causes a light having a predetermined wavelength region in each sub-pixel to pass. The thin film transistor substrate includes a first light-emitting layer that covers the entire display region and emits a light having one wavelength region, and a second light-emitting layer that emits a light having a wavelength region different from that of the first light-emitting layer, and covers a plurality of independent regions in the display region.

Here, different wavelength region means a region where wavelengths are not completely overlapped, and may include some regions that are overlapped. Each of the first light-emitting layer that covers the entire display region and the second light-emitting layer that covers the independent regions may be formed of a plurality of light-emitting layers. In this case, the wavelength regions that are emitted from the plurality of light-emitting layers may be completely coincident with each other, or may have different wavelength region rather than being completely coincident with each other.

In the light-emitting element display device in the aspect, the first light-emitting layer may emit a light that includes a wavelength region of green and red, and the second light-emitting layer may emit a light that includes a wavelength region of blue.

In the light-emitting element display device in the aspect, each of the plurality of independent regions may be the regions covering four sub-pixels or eight sub-pixels, or the number of sub-pixels covered by the plurality of independent regions may be increased.

In the light-emitting element display device in the aspect, each of the plurality of independent regions may be belt-shaped regions that extend in a vertical or horizontal direction with respect to an effective display area of the display device. The belt-shaped region may be the entire sub-pixels in the region, or the belt-shaped region may cross the display region vertically or horizontally.

In the light-emitting element display device in the aspect, the thin film transistor substrate may cover the entire display region, and may include a third light-emitting layer that emits a light having a wavelength region different from those of the first light-emitting layer and the second light-emitting layer.

DETAILED DESCRIPTION OF THE INVENTION

Figure 1:
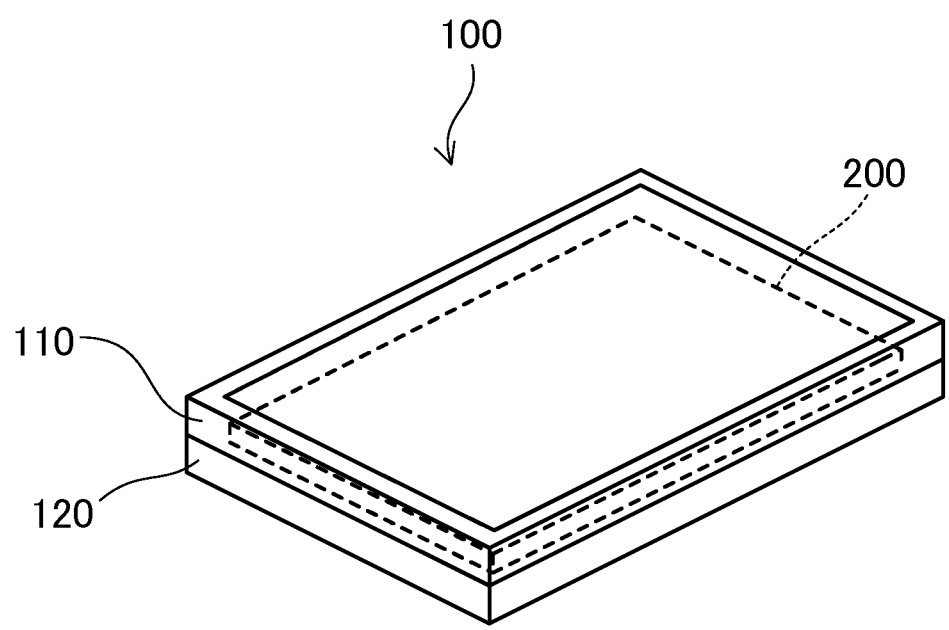
FIG. 1 is a diagram schematically illustrating an organic EL display device in an embodiment of the present invention.

Hereinafter, embodiments of the present invention will be described with reference to the drawings. The same or similar elements are referenced by the same reference numerals, and the duplicated descriptions will not be repeated.

In FIG. 1, an organic EL display device 100 in an embodiment of the present invention is schematically illustrated. As illustrated in FIG. 1, the organic EL display device 100 is configured from an organic EL panel 200 that is fixed so as to be interposed between an upper frame 110 and a lower frame 120.

Figure 2:
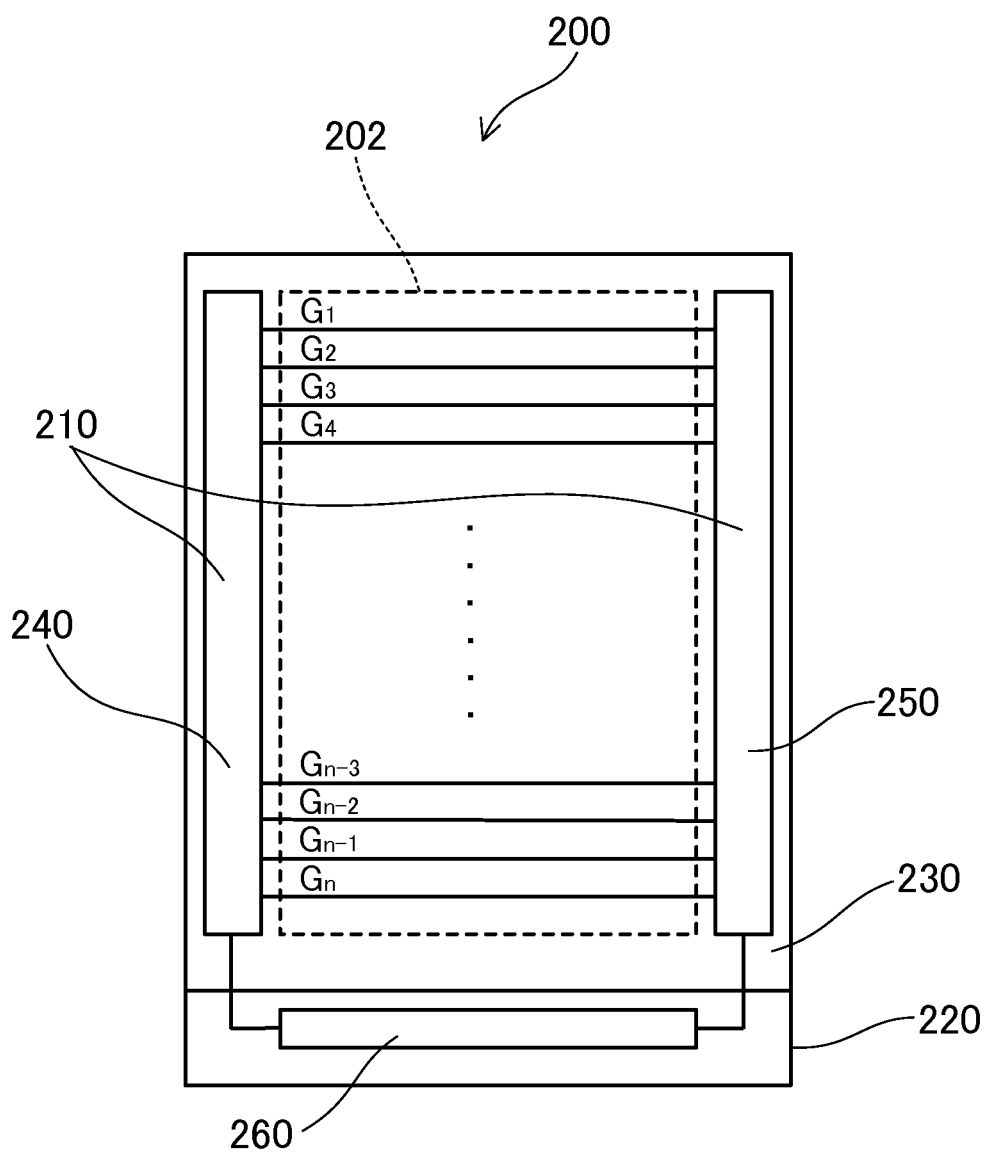
FIG. 2 is a diagram illustrating a configuration of the organic EL panel in FIG. 1.

In FIG. 2, a configuration of the organic EL panel 200 in FIG. 1 is illustrated. The organic EL panel 200 includes two substrates, a thin film transistor (TFT) substrate 220 and a color filter substrate 230, and those substrates are bonded together by transparent resin, or the like. The TFT substrate 220 includes, a drive circuit 210 that sequentially applies potential to scan signal lines G1 to Gn for conducting between the source and drain of the TFT of each pixel and a drive IC (integrated circuit) 260 that applies voltage corresponding to gradations of the pixel with respect to a plurality of data signal lines (not illustrated) which is extended so as to vertically intersect the scan signal lines G1 to Gn in the display region 202, and controls the drive circuit 210.

Figure 3:
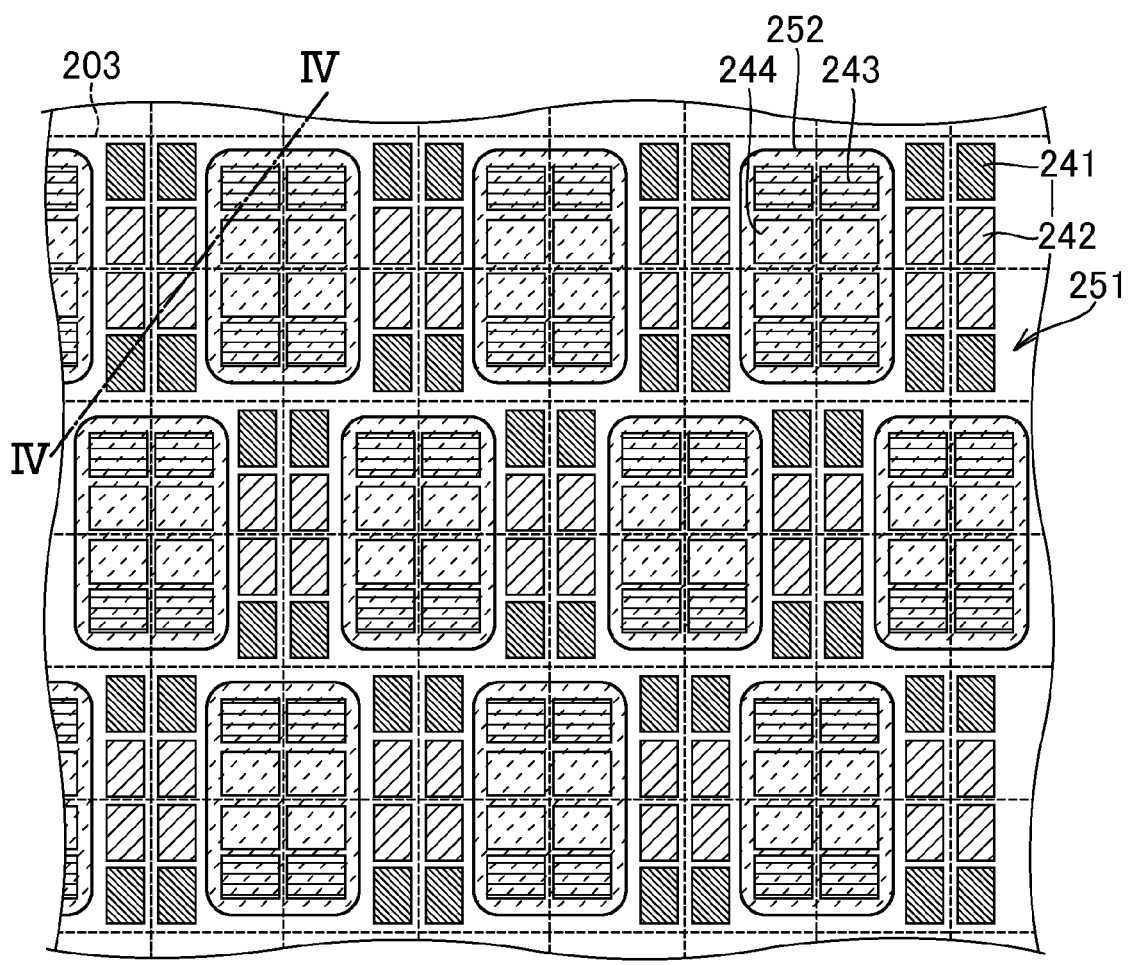
FIG. 3 is a plan view illustrating the organic EL panel with the display region being enlarged.

FIG. 3 is a plan view illustrating the organic EL panel 200 with the display region 202 being enlarged, and is a diagram illustrating an overlap of the color filter and the light-emitting layer. For the understandable explanation, each pixel is separated by virtual boundary lines 203. Each pixel includes a green (G) sub-pixel, a red (R) sub-pixel, a blue (B) sub-pixel, and a white (W) sub-pixel, and respectively includes a G color filter 241, an R color filter 242, a B color filter 243 and a W color filter 244 on color filter substrate 230. Regarding the W color filter, the light may be transmitted without the color filter, or a color filter that is colored in gray may be used.

On the TFT substrate 220, the first light-emitting layer 251 that emits the light of R+G or Y (yellow) is formed on the entire display region 202, and the second light-emitting layer 252 that emits the light of B is formed, so as to form a plurality of independent regions. In the present embodiment, each of the independent regions of the second light-emitting layer 252 is formed so as to be extended over four pixels, and is formed so as to overlap with the B color filter 243 and the W color filter 244 of each of the four pixels, that is, so as to cover eight sub-pixels. The light-emitting layer for R+G or Y may be formed in one layer or may be separately formed to be divided into two layers.

Figure 4:
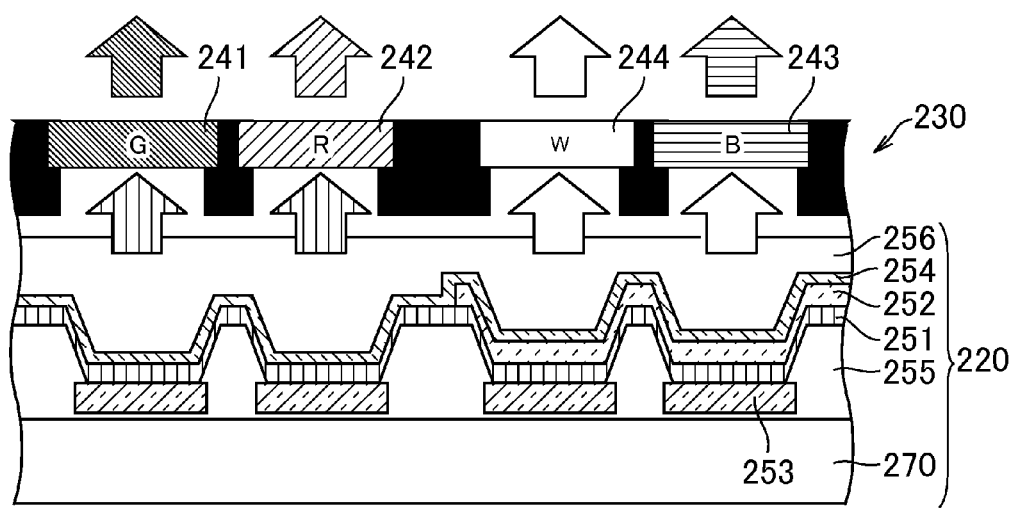
FIG. 4 is a diagram schematically illustrating a cross-section by line IV-IV in FIG. 3.

FIG. 4 is a diagram schematically illustrating a cross-section by line IV-IV in FIG. 3. As illustrated in FIG. 4, the TFT substrate 220 includes an anode electrode 253 independently formed for each pixel on a glass substrate 270 so as to be in contact with the first light-emitting layer 251 of each pixel and which is made from Ag; a cathode electrode 254 formed on the entire display region so as to be in contact with the first light-emitting layer 251 or the second light-emitting layer 252 and made from a transparent electrode such as indium tin oxide (ITO); a protection film 256 formed on the cathode electrode 254 and made from an organic insulation material; and a bank 255 formed on the anode electrode 253 side of the first light-emitting layer 251 and the second light-emitting layer 252, mainly between the pixels and made from the organic insulation material. A resin sheet instead of glass may be used in the substrate 270.

As indicated by arrows in FIG. 4, in the region where the second light-emitting layer 252 is not formed, the lights that have almost yellow color and include a green and red wavelength region emitted from the first light-emitting layer 251 pass through the G color filter 241 and the R color filter 242 and then, is emitted as the light of G or R respectively. On the other hand, in the region where the second light-emitting layer 252 is formed, the light that has almost yellow color emitted from the first light-emitting layer 251 is mixed with the light that has a blue wavelength region emitted from the second light-emitting layer 252, and then becomes white light. The white light passes through the B color filter 243 and the W color filter 244 and then, is emitted as the light of B and W respectively. Here, since the light that passed through the G color filter 241 and the R color filter 242 is the light that does not have the wavelength region of B, the light blocked in the color filter is less than the light that has the wavelength region of B, and can be more efficiently extracted than the lights of B and R. Since the second light-emitting layer 252 is formed only in the half of the display region 202, it is possible to reduce the power consumption compared to the case where the second light-emitting layer 252 is formed on the entire surface.

In designing the light-emitting layer, a thickness (light path length) of the light-emitting layer that is the light path length is designed in such a manner that a color of the light in which the reflection light in the anode and the direct light directly toward the color filter are resonated and thus output can be strengthened. Since the light path length specified for only R and G and the light path length specified for B can be separately designed compared to the case of the light of W being emitted from the entire surface, it is possible to increase the flexibility and improve the light emitting efficiency while designing the light-emitting layer.

Figure 5:
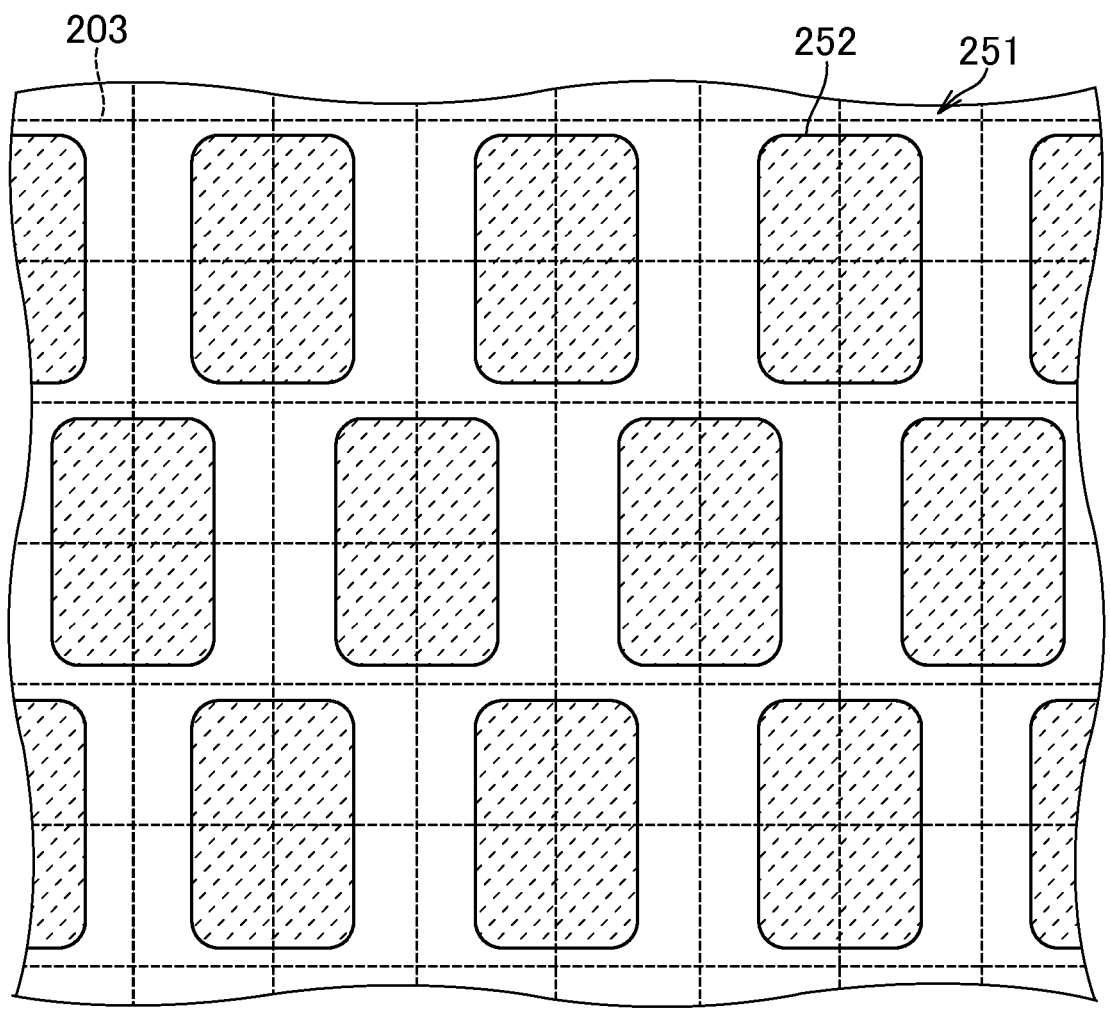
FIG. 5 is a diagram illustrating a state of arrangement of a first light-emitting layer and a second light-emitting layer formed on a TFT substrate.

FIG. 5 is a diagram illustrating a state of arrangement of the first light-emitting layer 251 and the second light-emitting layer 252 formed on the TFT substrate 220. As illustrated in FIG. 5, the first light-emitting layer 251 is formed on the entire surface of the display region 202, and the second light-emitting layers 252 are formed in plural on the independent regions extended over four pixels. Each of the first light-emitting layer 251 and the second light-emitting layer 252 are formed by vapor deposits. Since the formation is possible with getting four pixels (eight sub-pixels) together, even in a case of vapor deposit with coarse accuracy compared to the photolithography process, it is possible to array the pixels at high density, and thus, it is possible to form the light-emitting layers in high definition.

Figure 6:
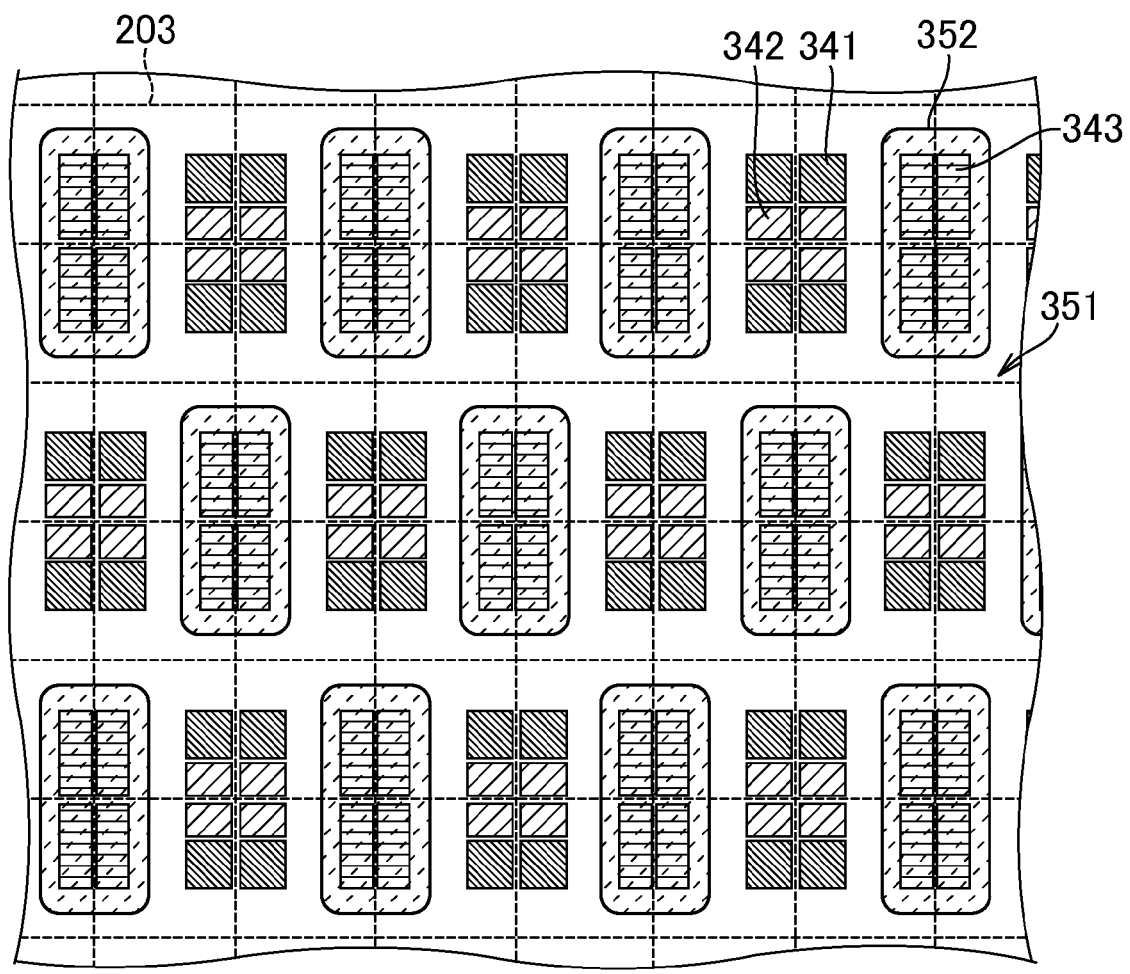
FIG. 6 is a plan view of a modification example in a case of having color filters of three colors R, G, and B with the display region being enlarged.

FIG. 6 is a plan view of a modification example in a case of having color filters of three colors R, G, and B with the display region 202 being enlarged, and is a diagram illustrating an overlapping of the color filter and the light emitting layer. As illustrated in FIG. 6, the color filter substrate is configured with three types of color filters: a G color filter 341, a R color filter 342, and a B color filter 343. Comparing to FIG. 3, the W color filter is removed and thus, the B color filter 343 is arranged so as to occupy a large area.

Figure 7:
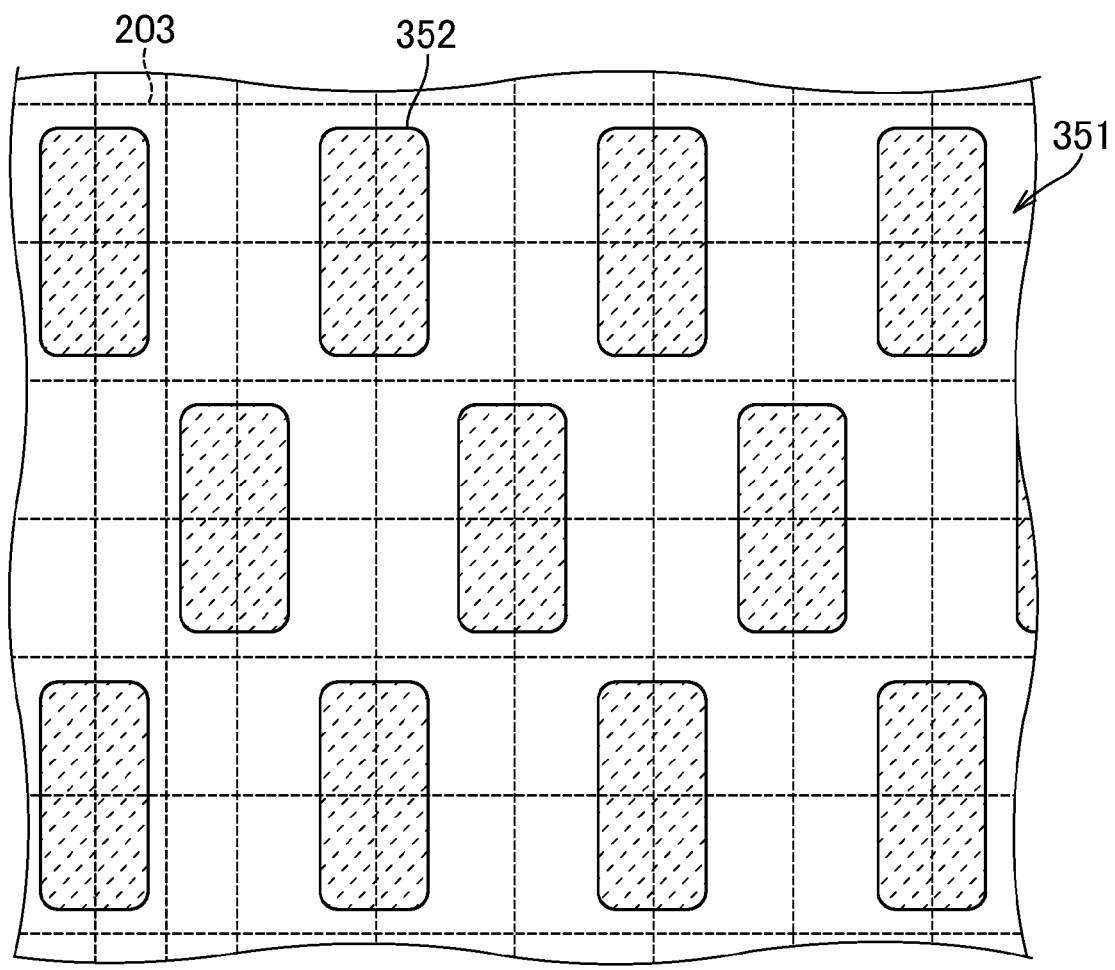
FIG. 7 is a diagram illustrating a state of arrangement of the first light-emitting layer and the second light-emitting layer formed on the TFT substrate in the modification example illustrated in FIG. 6.

FIG. 7 is a diagram illustrating a state of arrangement of the first light-emitting layer 351 and the second light-emitting layer 352 formed on the TFT substrate in the modification example illustrated in FIG. 6. Even in a case of the arrangement in this way, since the first light-emitting layer 351 that emits the light of R+G or Y is formed on the entire surface of the display region, and the second light-emitting layers 352 that emit the light of B are formed to be extended over four pixels and to cover four sub-pixels of B, and are formed in plural on the independent regions, it is possible to obtain the effects similar to the embodiment described above.

Figure 8:
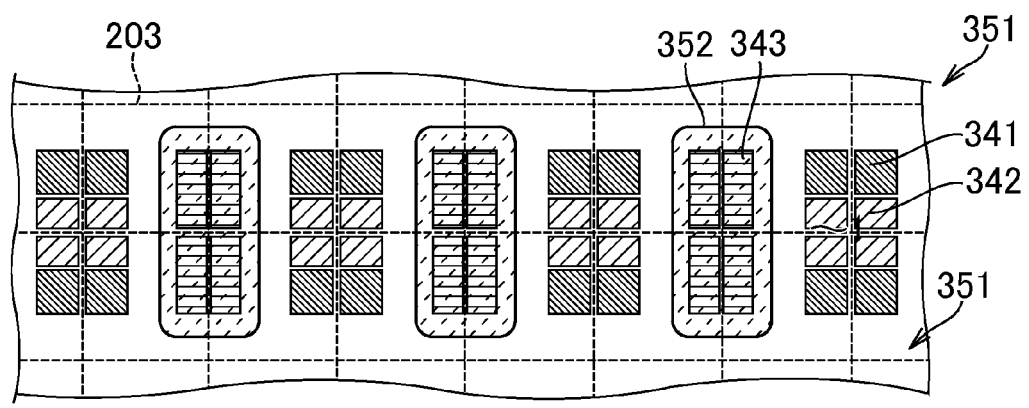
FIG. 8 is a diagram illustrating a size of an opening in the organic EL display panel having sub-pixels of three colors R, G, and B in a case where the first light-emitting layer and the second light-emitting layer in FIG. 6 and FIG. 7 are used.
Figure 9:
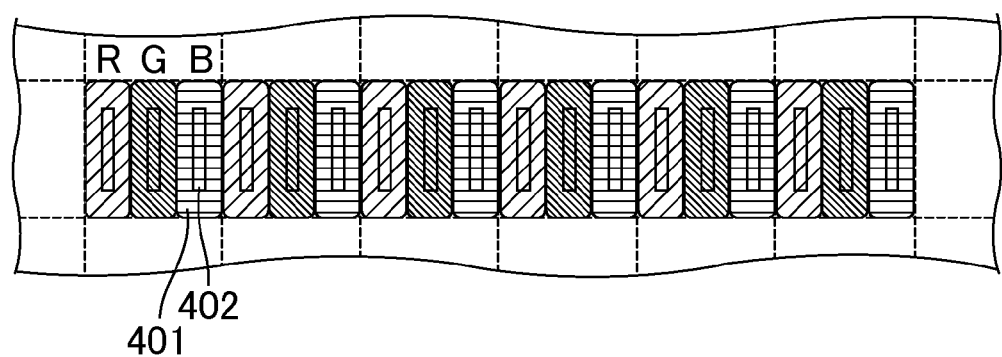
FIG. 9 is a diagram illustrating a size of an opening in the organic EL display panel having sub-pixels of three colors R, G, and B in a case where the light-emitting layer is formed for each of the colors R, G, and B.

FIG. 8 and FIG. 9 are diagrams for comparing the configuration in the present invention with the configurations in the related art. FIG. 8 illustrates the pixel configuration in the present invention, and FIG. 9 illustrates the pixel configuration in the related art, in which the pixels of R, G, and B are alternately arranged. As illustrated in FIGS. 8 and 9, for example, the B color filter 343 is larger than an opening portion 402 of a light-emitting layer 401. Therefore, by configuring the pixel configurations as in the modification example and the present embodiment, the opening ratio can be increased, and the power consumption can be suppressed. In the pixel configuration in the present embodiment, since the interval between the adjacent second light-emitting layers 352 is wider than that in the pixel configuration in the related art. Therefore, it becomes easy to manufacture the display device.

Figure 10:
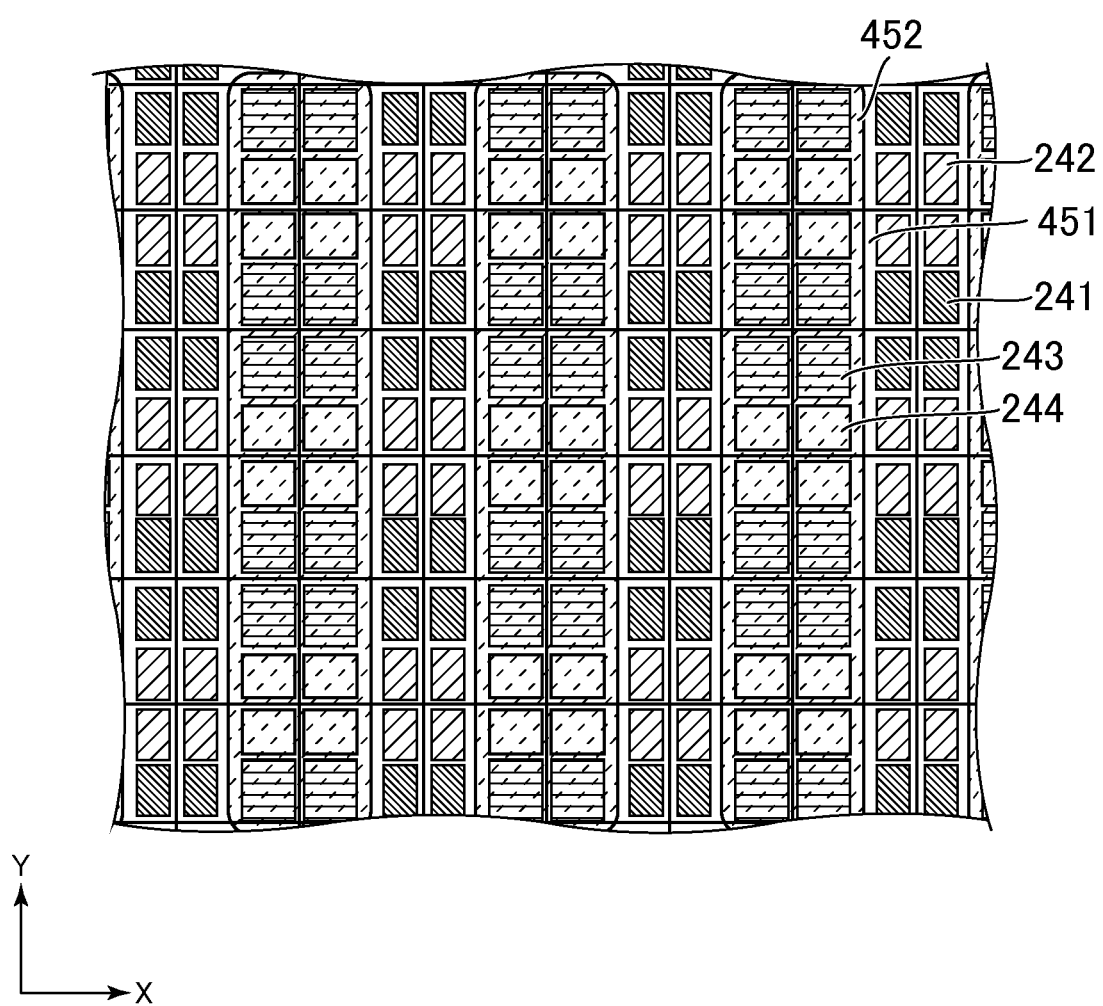
FIG. 10 is a plan view illustrating the organic EL panel with the display region being enlarged.

FIG. 10 is a plan view illustrating the modification example of the present invention. FIG. 10 is a plan view illustrating the organic EL panel 200 with the display region 202 being enlarged, and illustrates the overlapping of the color filter and the light-emitting layer. Each of a plurality of independent regions is formed on the belt-shaped region having a long axis in X direction. The width in Y direction perpendicular to X direction is larger than that of the blue or white sub-pixels, and the width covers two sub-pixels of blue and white.

Even in a case of arrangement in this way, since the first light-emitting layer 451 that emits the light of R+G or Y is formed on the entire surface of the display region and the second light-emitting layers 452 that emit the light of B are formed to be extended over four pixels and to cover four sub-pixels of B, and are formed in plural on the independent regions, it is possible to obtain the effects similar to the embodiment described above. Since the second light-emitting layer 452 that emits the light of B is formed in stripe shape, it is easy to align the position of the second light-emitting layer in a longitudinal direction in each pixel.

In the embodiment described above, the first light-emitting layer of the light of R+G or Y and the second light-emitting layer of the light of B are used. However, the light-emitting layer of the combination of other colors may be used, and in this case, by forming the light-emitting layer as a multilayer, it may also be possible to form a light-emitting layer such that the light that includes the desired wavelength region is emitted.

In the embodiment described above, the light-emitting element display device is a top emission type, but a bottom emission type may also be used. A light-emitting device that is classified as a so-called an organic EL is used for the light-emitting layer. However, other device such as a self-luminous type element that emits the light by itself may also be used.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A light-emitting element display device comprising:
    a thin film transistor substrate that includes a transistor which controls an amount of light emission from each sub-pixel arranged on an entire display region; and
    a color filter substrate that is arranged to overlap with the thin film transistor substrate, and comprises a first color filter through which a first light having a first wavelength region is capable of passing, a second color filter through which a second light having a second wavelength region is capable of passing, and a third color filter through which a third light having a third wavelength region is capable of passing,
    wherein the thin film transistor substrate comprises
    a first light-emitting layer that covers the entire display region and emits the first light and the second light,
    a second light-emitting layer that emits the third light, covers a plurality of independent regions in the display region, and overlaps with the first light-emitting layer,
    the first color filter and the second color filter are disposed over a portion of the first light-emitting layer where the first light-emitting layer does not overlap with the second light-emitting layer, and
    the third color filter is disposed above the second light-emitting layer.

2. The light-emitting element display device according to claim 1,
    wherein the first light-emitting layer emits a light that includes a wavelength region of green and red, and
    wherein the second light-emitting layer emits a light that includes a wavelength region of blue.

3. The light-emitting element display device according to claim 1,
    wherein each of the plurality of independent regions is the regions covering four sub-pixels or eight sub-pixels.

4. The light-emitting element display device according to claim 1,
    wherein each of the plurality of independent regions is belt-shaped region.

5. The light-emitting element display device according to claim 1,
    wherein the thin film transistor substrate covers the entire display region, and further comprises a third light-emitting layer that emits a light having a wavelength region different from those of the first light-emitting layer and the second light-emitting layer.

6. The light-emitting element display device according to claim 1,
    wherein the color filter substrate comprises a transparent filter through which the first light, the second light, and the third light are capable of passing.

7. The light-emitting element display device according to claim 6,
    wherein the transparent filter is disposed over the second light-emitting layer.

* * * * *